United States Patent
Gong et al.

(10) Patent No.: US 12,399,228 B2
(45) Date of Patent: Aug. 26, 2025

(54) METHOD AND SYSTEM FOR IMPROVED STATE ESTIMATION ACCURACY IN BATTERY MANAGEMENT SYSTEMS WITH CELL BALANCING

(71) Applicants: THE GOVERNING COUNCIL OF THE UNIVERSITY OF TORONTO, Toronto (CA); ELEAPPOWER LTD., North York (CA)

(72) Inventors: Zhe Gong, Toronto (CA); Olivier Trescases, Toronto (CA)

(73) Assignees: THE GOVERNING COUNCIL OF THE UNIVERSITY OF TORONTO, Toronto (CA); ELEAPPOWER LTD., Toronto (CA)

( * ) Notice: Subject to any disclaimer, the term of this patent is extended or adjusted under 35 U.S.C. 154(b) by 0 days.

(21) Appl. No.: 18/826,728

(22) PCT Filed: Mar. 7, 2022

(86) PCT No.: PCT/CA2022/050322
§ 371 (c)(1),
(2) Date: Sep. 6, 2024

(87) PCT Pub. No.: WO2023/168508
PCT Pub. Date: Sep. 14, 2023

(65) Prior Publication Data
US 2025/0164570 A1    May 22, 2025

(51) Int. Cl.
*G01R 31/392* (2019.01)
*G01R 31/367* (2019.01)
(Continued)

(52) U.S. Cl.
CPC ......... *G01R 31/392* (2019.01); *G01R 31/367* (2019.01); *G01R 31/396* (2019.01);
(Continued)

(58) Field of Classification Search
CPC .. G01R 31/392; G01R 31/367; G01R 31/396; G01R 27/16; G01R 31/66;
(Continued)

(56) References Cited

U.S. PATENT DOCUMENTS

| | | | | |
|---|---|---|---|---|
| 7,535,198 B2* | 5/2009 | Lee | ........ | H02J 7/0019 320/118 |
| 7,638,977 B2* | 12/2009 | Park | ........ | H02J 7/0031 361/88 |
| 7,786,701 B2* | 8/2010 | Altemose | ........ | H02J 7/0018 320/136 |
| 9,685,796 B2* | 6/2017 | Poirier | ........ | B60L 58/22 |

(Continued)

*Primary Examiner* — Tung S Lau
(74) *Attorney, Agent, or Firm* — Norton Rose Fulbright Canada LLP

(57) ABSTRACT

When balancing cells in battery packs, the voltage induced by the balancing current across the parasitic wire resistance distorts the measured cell voltage, leading to inaccurate cell state estimation. A method and battery management system to extract a parasitic resistance of battery connection wires connecting a cell of a battery to a cell balancing circuit is disclosed. The parasitic wire resistances for a battery pack are extracted through the coordinated operation of a pack-level current source and cell-level balancing circuit. A voltage drop is imposed and measured across the parasitic resistances while maintaining zero current in the immediate battery cell. Maintaining zero current in the immediate battery cell avoids possible extraction error resulting from voltage drop across the battery cell impedance due to battery cell current flow.

13 Claims, 13 Drawing Sheets

(51) Int. Cl.
  *G01R 31/396* (2019.01)
  *H01M 10/42* (2006.01)
  *H01M 10/44* (2006.01)
  *H01M 50/502* (2021.01)
  *H02J 7/00* (2006.01)

(52) U.S. Cl.
  CPC ..... *H01M 10/4207* (2013.01); *H01M 10/441* (2013.01); *H01M 50/502* (2021.01); *H02J 7/0019* (2013.01); *H02J 7/0047* (2013.01)

(58) Field of Classification Search
  CPC ........... H01M 10/4207; H01M 10/441; H01M 50/502; H01M 10/052; H01M 10/425; H01M 10/4285; H01M 10/48; H02J 7/0019; H02J 7/0047; H02J 7/00032; H02J 7/0029; H02J 7/0014; Y02E 60/10
  See application file for complete search history.

(56) References Cited

U.S. PATENT DOCUMENTS

| | | | |
|---|---|---|---|
| 10,326,287 B2* | 6/2019 | Hoyt | H02J 7/0024 |
| 2005/0194933 A1* | 9/2005 | Arnold | H02J 7/00712 |
| | | | 320/128 |
| 2006/0139008 A1* | 6/2006 | Park | H01M 50/569 |
| | | | 320/134 |
| 2008/0018305 A1 | 1/2008 | Altemose | |
| 2013/0049678 A1* | 2/2013 | Li | H02J 7/007192 |
| | | | 320/136 |
| 2016/0336623 A1 | 11/2016 | Nayar et al. | |
| 2016/0344203 A1* | 11/2016 | Poirier | B60L 58/22 |
| 2017/0310136 A1* | 10/2017 | Chang | H02J 7/007182 |
| 2018/0095136 A1 | 4/2018 | Nagato et al. | |
| 2018/0278065 A1* | 9/2018 | Hoyt | H02J 7/0024 |
| 2023/0384386 A1* | 11/2023 | Ekler | G01R 31/396 |
| 2025/0164570 A1* | 5/2025 | Gong | G01R 31/392 |

* cited by examiner

METHOD AND SYSTEM FOR IMPROVED STATE ESTIMATION ACCURACY IN BATTERY MANAGEMENT SYSTEMS WITH CELL BALANCING

TECHNICAL FIELD

The present invention relates generally to battery management systems and, more particularly, to battery management systems featuring cell balancing, which may disrupt cell monitoring and state estimation.

BACKGROUND

Electric vehicles (EV) predominantly utilize lithium-ion batteries. A battery management system (BMS) is typically present to continuously monitor battery status. The BMS may monitor cell voltage, temperature, current, state-of-charge (SOC) as well as estimate available power. The battery management system may also perform cell balancing. Balancing the cells improves battery performance and lifespan.

In battery management systems, measurement inaccuracies may arise due to parasitic cell connection resistance. Consequently, the BMS may be unable to accurately determine SOC and available power. There is a need for an improved battery management system to extract the parasitic cell resistance to thereby improve the accuracy and performance of the battery management system.

SUMMARY

In general, a method and battery management system are provided to extract a parasitic resistance of battery connection wires connecting a cell of a battery to a cell balancing circuit. The method and system improve the accuracy of battery state estimation as will be explained in detail below.

One aspect of the present invention is a method of extracting a parasitic resistance of battery connection wires in a battery, wherein the battery comprises a plurality of cells, each respective cell of the plurality of cells comprising battery connection wires connecting battery terminals of the respective cell to a cell balancing circuit, the method comprising: for each respective cell of the plurality of cells and for a contiguous group of two or more adjacent cells: controlling a pack current through the battery to be zero; measuring a first cell voltage of the respective cell, or a first contiguous cell group voltage as a sum of respective cell voltages of the two or more adjacent cells in the contiguous group, with no pack current flowing through the battery; controlling the pack current through the battery to be non-zero; applying a balancing current to the respective cell or to each of the two or more adjacent cells in the contiguous group, equal to the pack current and flowing in an opposite direction to the pack current; measuring a second cell voltage of the respective cell, or a second contiguous cell group voltage as a sum of respective cell voltages of the two or more adjacent cells in the contiguous group, with the balancing current applied to the respective cell or to each of the two or more adjacent cells in the contiguous group; determining a total voltage drop across the battery connection wires of the respective cell or of the two or more adjacent cells in the contiguous group based on the difference between the first and second cell voltages; and determining a total parasitic resistance of the battery connection wires of the respective cell or of the two or more adjacent cells in the contiguous group based on the total voltage drop and the balancing current; and computing a respective parasitic resistance of respective battery connection wires in the battery based on the total parasitic resistances of the battery connection wires.

In some aspects, computing the respective parasitic resistance of respective battery connection wires in the battery comprises solving a system of linear equations.

In some aspects, the method is performed for each respective cell and for the contiguous group of cells in real-time.

In some aspects, the method is performed for each respective cell and for the contiguous group of cells at different times.

In some aspects, the contiguous group of cells comprises two adjacent cells.

In some aspects, the contiguous group of cells comprises all of the plurality of cells.

In some aspects, the method further comprises: using the computed parasitic resistances of respective battery connection wires to estimate a battery state of the battery.

In some aspects, the cell voltages are measured using the battery connection wires, opposite to the battery terminals of the respective cells.

In some aspects, the method further comprises back-calculating actual cell terminal voltages based on the measured cell voltages and using the parasitic resistances when the balancing current flows.

In some aspects, the method further comprises estimating, using a battery state estimator, the battery cell states-of-charge and open-circuit voltage using the back-calculated actual cell terminal voltages.

In some aspects, the method further comprises: tracking the parasitic resistances of the battery connection wires over time and periodically comparing the parasitic resistances to a recorded nominal value; and checking for a mismatch beyond a predetermined mismatch threshold to determine whether corrosion or connection faults have occurred.

In some aspects, the method further comprises: communicating with an external control unit in the battery management system when the mismatch exceeds the predetermined mismatch threshold.

In some aspects, the battery is a lithium-ion battery.

Another aspect of the present invention is a battery management system capable of extracting a parasitic resistance of battery connection wires in a battery, wherein the battery comprises a plurality of cells, each respective cell of the plurality of cells comprising battery connection wires connecting battery terminals of the respective cell to a cell balancing circuit, the system comprising a control unit configured to: for each respective cell of the plurality of cells and for a contiguous group of two or more adjacent cells: control a pack current through the battery to be zero; measure a first cell voltage of the respective cell, or a first contiguous cell group voltage as a sum of respective cell voltages of the two or more adjacent cells in the contiguous group, with no pack current flowing through the battery; control the pack current through the battery to be non-zero; apply a balancing current to the respective cell or to each of the two or more adjacent cells in the contiguous group, equal to the pack current and flowing in an opposite direction to the pack current; measure a second cell voltage of the respective cell, or a second contiguous cell group voltage as a sum of respective cell voltages of the two or more adjacent cells in the contiguous group, with the balancing current applied to the respective cell or to each of the two or more adjacent cells in the contiguous group; determine a total voltage drop across the battery connection wires of the respective cell or of the two or more adjacent cells in the contiguous group based on the difference between the first and second cell voltages; and determine a total parasitic resistance of the battery connection wires of the respective cell or of the two or more adjacent cells in the contiguous group based on the total voltage drop and the balancing current; and compute a respective parasitic resistance of respective battery connection wires in the battery based on the total parasitic resistances of the battery connection wires.

In some aspects, the control unit is configured to compute the respective parasitic resistance of respective battery connection wires in the battery by solving a system of linear equations.

In some aspects, the control unit is configured to perform measurements for each respective cell and for the contiguous group of two or more adjacent cells in real-time.

In some aspects, the control unit is configured to perform measurements for each respective cell and for the contiguous group of two or more adjacent cells at different times.

In some aspects, the contiguous group of cells comprises two adjacent cells.

In some aspects, the contiguous group of cells comprises all of the plurality of cells.

In some aspects, the control unit is further configured to: use the computed parasitic resistances of respective battery connection wires to estimate a battery state of the battery.

In some aspects, the cell voltages are measured using the battery connection wires, opposite to the battery terminals of the respective cells.

In some aspects, the control unit is further configured to back-calculate actual cell terminal voltages based on the measured cell voltages and using the parasitic resistances when the balancing current flows.

In some aspects, the control unit is further configured to estimate, using a battery state estimator, the battery cell states-of-charge and open-circuit voltage using the back-calculated actual cell terminal voltages.

In some aspects, the control unit is further configured to: track the parasitic resistances of the battery connection wires over time and periodically compare the parasitic resistances to a recorded nominal value; and check for a mismatch beyond a predetermined mismatch threshold to determine whether corrosion or connection faults have occurred.

In some aspects, the processing unit is further configured to: communicate with an external control unit in the battery management system when the mismatch exceeds the predetermined mismatch threshold.

In some aspects, the battery is a lithium-ion battery.

The foregoing presents a simplified summary of the invention in order to provide a basic understanding of some aspects of the invention. This summary is not an exhaustive overview of the invention. It is not intended to identify essential, key or critical elements of the invention or to delineate the scope of the invention. Its sole purpose is to present some concepts in a simplified form as a prelude to the more detailed description that is discussed later. Other aspects of the invention are described below in relation to the accompanying drawings.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION

Parasitic resistance is inherent to battery connection wires in battery systems, which causes terminal voltage measurement distortion when performing cell balancing as the battery connection wire carrying the balancing current is also used for voltage sensing. The distortion in the terminal voltage measurement leads to inaccuracies in battery state estimation. The present disclosure provides a method and battery management system that is able to extract a parasitic resistance of battery connection wires that connect a cell of a battery to a cell balancing circuit. In accordance with the present disclosure, parasitic resistance of battery connection wires in respective cells is determined by a process of controlling the current through the respective cells using both a controllable current source providing a pack current through the battery, as well as current provided from a cell balancing circuit. Since the parasitic resistance of the battery connection wires in a respective cell is determined by controlling the current through that respective cell, and does not rely upon controlling a current through an adjacent cell, the method for determining parasitic resistance is equally applicable to end of stack wires which have no adjacent cells.

Figure 1:
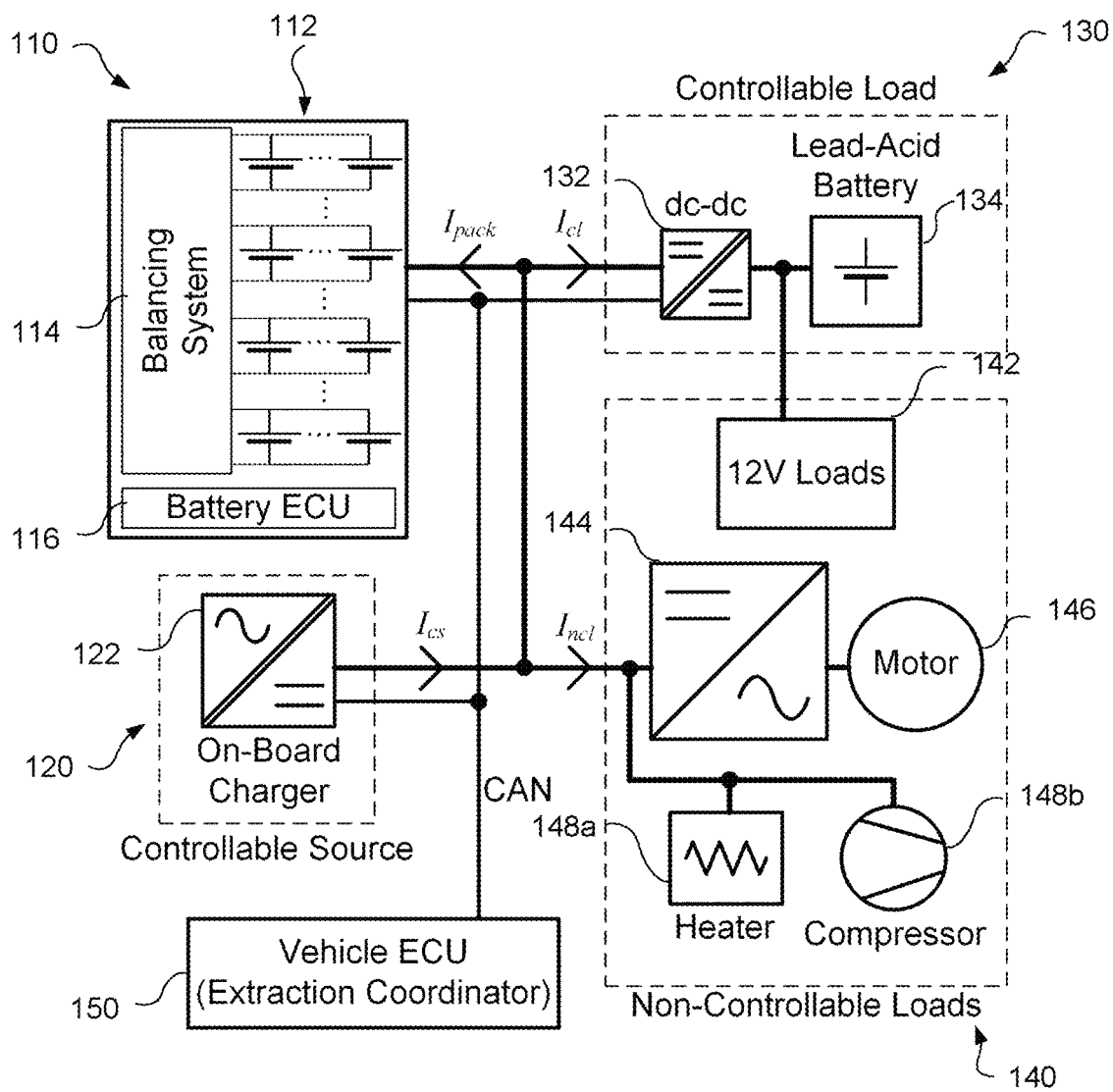
FIG. 1 depicts a typical electric vehicle system architecture 100.

FIG. 1 depicts a typical electric vehicle system architecture 100 with electrical connections indicated in 'single-line' format. In the 'single-line' format, one line is used to indicate an electrical connection consisting of the typical two wires required to enable electrical power transfer.

As shown in FIG. 1, the electric vehicle system architecture 100 generally comprises a battery system 110, a controllable source 120, a controllable load 130, non-controllable loads 140, and a Vehicle Electronic Control Unit 150, as described in more detail herein below.

In FIG. 1, the battery system 110 is connected to various elements of the electric vehicle system, including:

- a dc-dc converter 132 that provides power to the vehicle's '12V' or 'auxiliary' power bus, which consists of low-power 12V loads 142 including vehicle instrumentation, infotainment systems, and actuators;
- a traction ac-dc converter 144 that provides power to one or more propulsion motors 146 (the ac-dc converter 144 may be implemented as multiple units placed in different areas of the vehicle);
- a set of Heating, Ventilation, and Air-Conditioning (HVAC) components 148a and 148b, which may include electrical heating elements, coolant pumps, fans, and refrigerant compressors (these components typically facilitate heat transfer between the motor, battery, electrical power converters, passenger cabin, and the ambient environment); and
- an on-board charger 122 meant for charging the battery 110 from the power grid through a charging port located on the car body.

Depending on the vehicle operating mode (e.g. idle, charging, drive-enabled), an electric vehicle battery pack experiences varying charging and discharging current. The battery pack current, $I_{pack}$, is the combination of all currents imposed by the modules connected together in the vehicle power system. In non-vehicle battery-powered electrical systems, including renewable energy storage systems and portable electronic devices, similar general architectures exist where multiple electronic modules in the system may simultaneously charge and discharge the battery pack, resulting in an equivalent combined battery pack current.

The EV components in the system architecture 100 are divisible according to whether their operating power may be controlled during normal operation (driving, charging, idle, etc.) without causing disruption. In a typical EV, a Vehicle Electronic Control Unit (ECU) 150 is implemented to aggregate sensed data and coordinate the system operation. The Vehicle ECU 150 typically communicates with other system modules over a Controller Area Network. In the EV architecture diagram, the components are organised as follows.

The battery system 110 acts as the system voltage source by sinking or sourcing the net power of all system loads and power sources. The battery pack current is denoted $I_{pack}$. The battery system 110 comprises a plurality of cells 112, a balancing system 114, and a Battery ECU 116. Each cell of the plurality of cells may comprise one or more batteries forming a group connected together in parallel. A battery pack is formed by the series connection of all the cell units. The Balancing System 114 is controllable, and classification as a load or source depends on the implementation. The battery ECU 116 communicates with the balancing system 114 to perform cell balancing on the plurality of cells 112, and also communicates with the vehicle ECU 150, such as to receive instructions to perform wire resistance extraction as disclosed herein, and to report results of the wire resistance extraction (e.g. an indication of a damaged wire) and battery characteristics such as State of Charge (SOC), etc.

The Controllable Source(s) 120 provide power to the system. The on-board charger 122 is an example of a controllable source because it typically follows a battery pack charging sequence that is defined by the Battery ECU 116. The current provided to the system by the controllable source is denoted $I_{cs}$.

The Controllable Loads 130 consume power in the system. The dc-dc converter 132 that supplies the 12V auxiliary system loads 142 is an example of a controllable load due to the presence of the Lead-Acid (PbA) battery 134. The dc-dc converter 132 may choose to provide an arbitrary amount of power to the 12V system comprising 12V loads 142, subject to the power and energy storage constraints of the PbA battery 134. The current draw of the Controllable Loads is denoted $I_{cl}$.

The Non-Controllable Loads 140 consume power in the system according to the vehicle operation. These loads must be met to avoid disruption to EV operations. The current draw of the Non-Controllable Loads is denoted $I_{ncl}$.

Figure 2A:
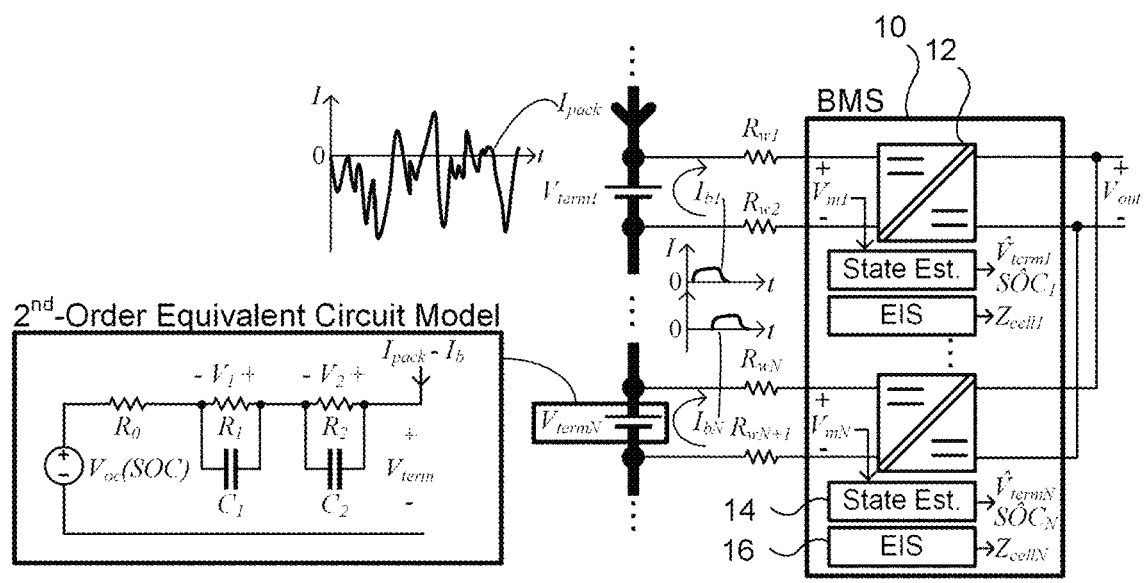
FIG. 2A depicts a representation of a state-of-the-art battery management system (BMS).
Figure 2B:
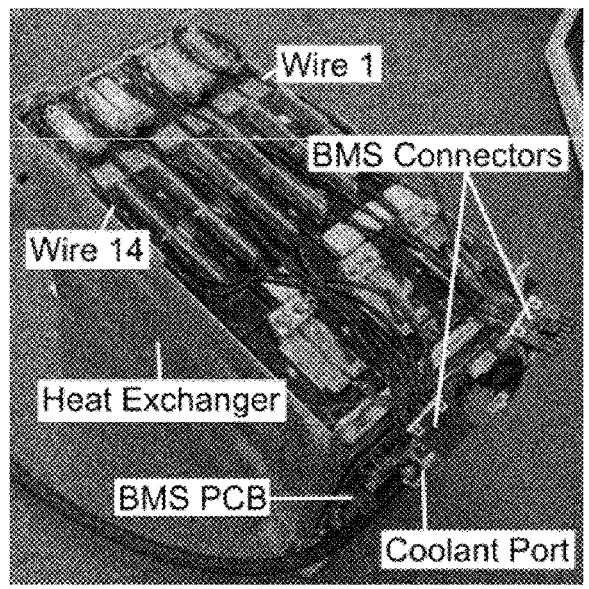
FIG. 2B depicts a custom 12S2P, 88 Ah, liquid-cooled Lithium NMC module with custom BMS.

FIG. 2A depicts a representation of a state-of-the-art battery management system (BMS) denoted by reference numeral 10 that may be used within the battery system 110 described in FIG. 1. The BMS 10 includes a cell balancing circuit 12 for active cell balancing, and a state estimator 14 configured to sample the cell voltages and pack current, and estimate the SOC and available charge/discharge power. The state estimator performs the sample and estimation at kHz-range, to avoid signal aliasing. The BMS 10 also includes an online electrochemical impedance spectroscopy (EIS) module 16. A custom 12S2P, 88 Ah liquid-cooled Lithium Nickel Manganese Cobalt (NMC) battery module with a custom state-of-the-art BMS are shown in FIG. 2B. In the embodiment depicted in FIG. 2B, the BMS has a Printed Circuit Board (PCB) and BMS connectors.

Estimating the SOC and peak power in a battery pack is typically carried out using Equivalent Circuit Models (ECM) that represent the cell voltage-to-current response, such as what is shown in FIG. 2A. It is common to apply a closed-loop state estimator, such as a state observer or Kalman filter, to reject sensing inaccuracy, and estimate the non-measurable state variables, including SOC and voltage-limited available power. The state estimation frequency is application-dependent, and may be chosen to avoid signal aliasing. In some prior art systems, for example, the measured battery pack current, $I_{pack}$, contains significant harmonic components in the kHz-range. The current harmonics arise from operation of high-voltage-battery-connected power electronics, including the drive inverter, 400V-to-12V auxiliary power supply, and electro-magnetic rotational machines required for liquid thermal management. Distributed BMS computing architectures that leverage module-level processing power for cell state estimation have reduced data communication traffic and lower single-processor load, compared to central schemes where hundreds of cell models are aggregated.

Distributed architectures thus provide improved support for high-frequency state estimation. In at least one embodiment, each BMS module contains a low-cost field programmable gate array (FPGA) for intra-module state estimation and active balancing converter compensation.

Capacity and impedance mismatch between series-connected cells occur over the battery pack life due to manufacturing variation and temperature gradients. Under these mismatches, the cell balancing current should be applied to prevent the lowest-capacity or highest-impedance series-connected cells from limiting the pack performance. In applications such as autonomous electric vehicles (EVs) and grid ancillary services, batteries experience high-duty-cycle usage, and cell balancing is typically implemented, to equalize the diverging SOC and maximize the available power. Cell balancing circuits with isolated DC-DC converters, such as the one shown in FIG. 2C, have also been proposed to simultaneously balance the cells and supply the vehicle Low-Voltage (LV) load, which includes some HVAC components, instrumentation, and small actuators. This concept eliminates the typical EV 400-to-12V DC-DC converter, saving incremental balancing system cost.

Figure 2C:
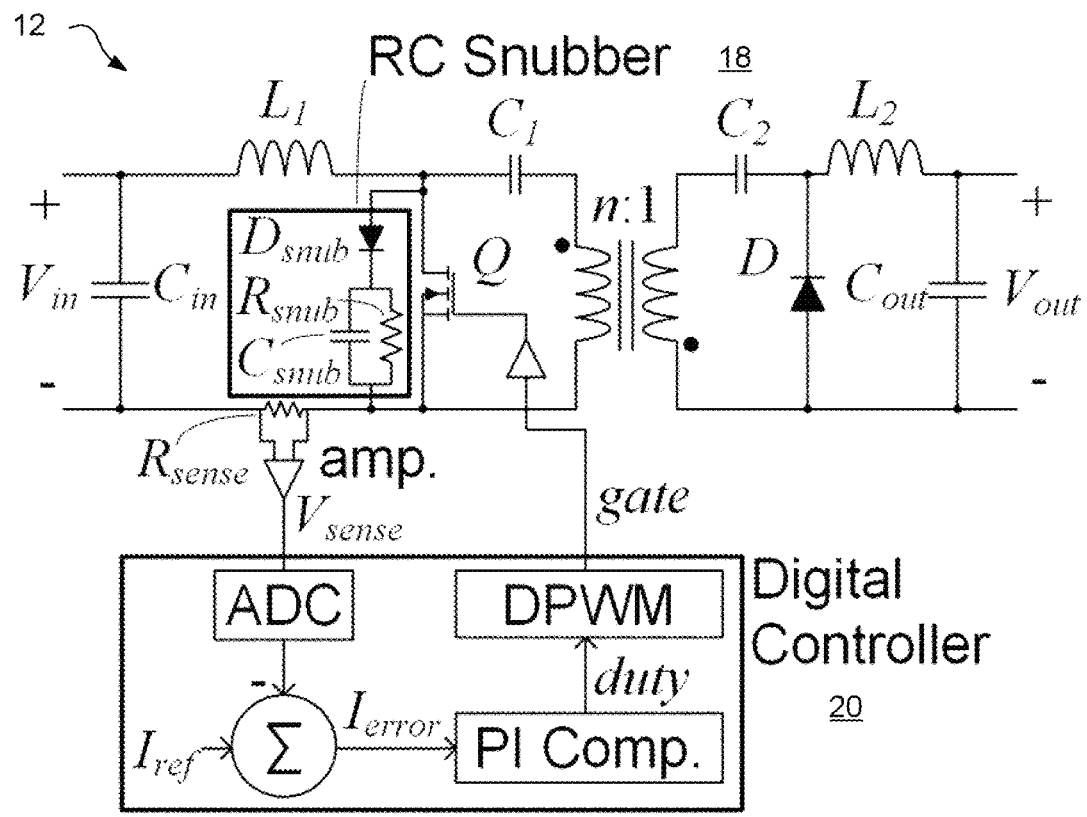
FIG. 2C depicts an isolated Ćuk converter and compensator used for active balancing in the custom BMS.

FIG. 2C depicts an isolated Ćuk converter and compensator used for active balancing in the custom BMS. In at least one embodiment, a switch matrix enables one converter of FIG. 2C to be time-shared among the cells in each module, for simultaneous balancing and LV bus supply. In the embodiment depicted in FIG. 2C, the cell balancing circuit 12 includes an RC snubber 18 and a digital controller 20 operating as a control unit for controlling the cell balancing circuit. It will be appreciated that the control unit may be part of the cell balancing circuit or external to the cell balancing circuit but connected thereto, such as part of Battery ECU 116 in FIG. 1.

Figure 2D:
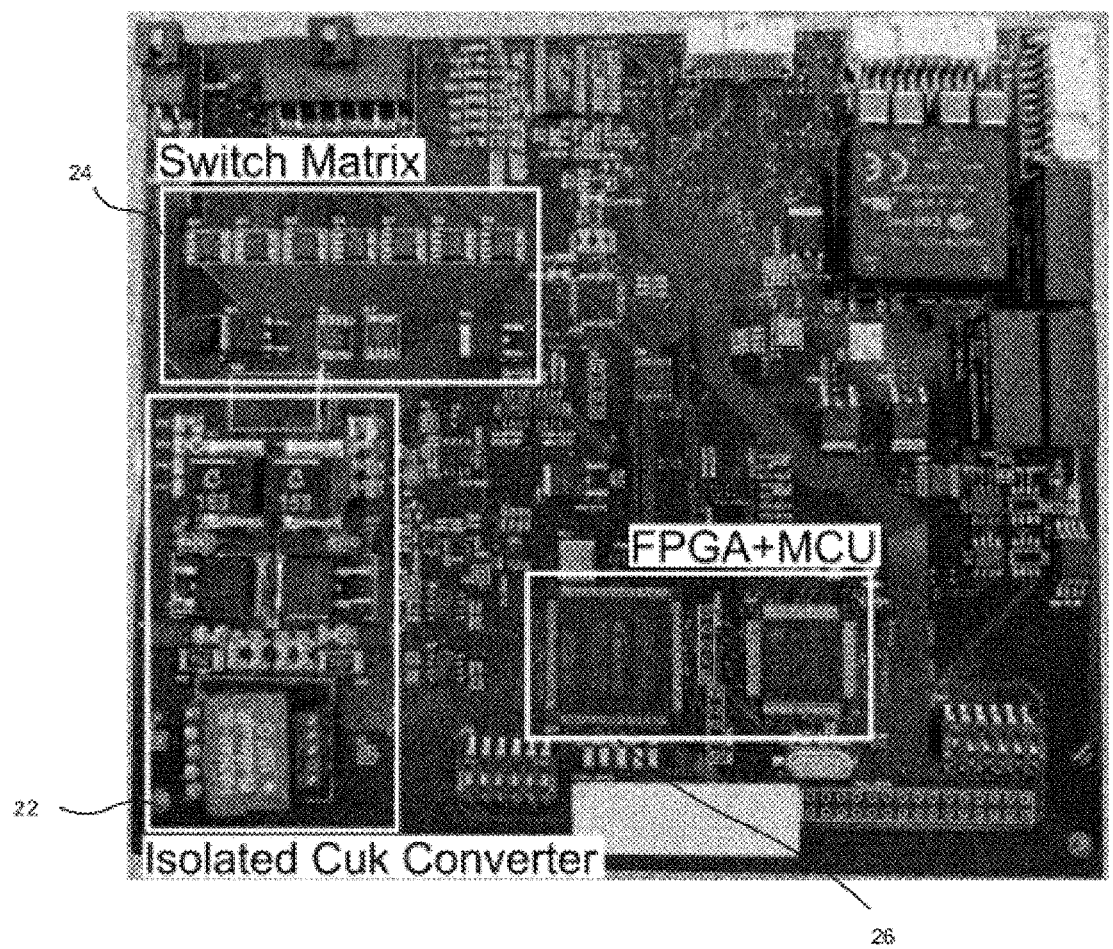
FIG. 2D depicts a BMS module on a PCB.

FIG. 2D depicts a BMS module on a PCB. A 250 kHz isolated Ćuk balancing converter 22, supports up to 63 W at 25V $V_{in}$ and 12V $V_{out}$. As depicted in FIG. 2D, the converter 22 cooperates with a switch matrix 24 and is controlled by an FPGA (Field-Programmable Gate Array) and MCU (Micro-Controller Unit) 26 operating as the control unit.

State Estimation Distortion

Figure 2E:
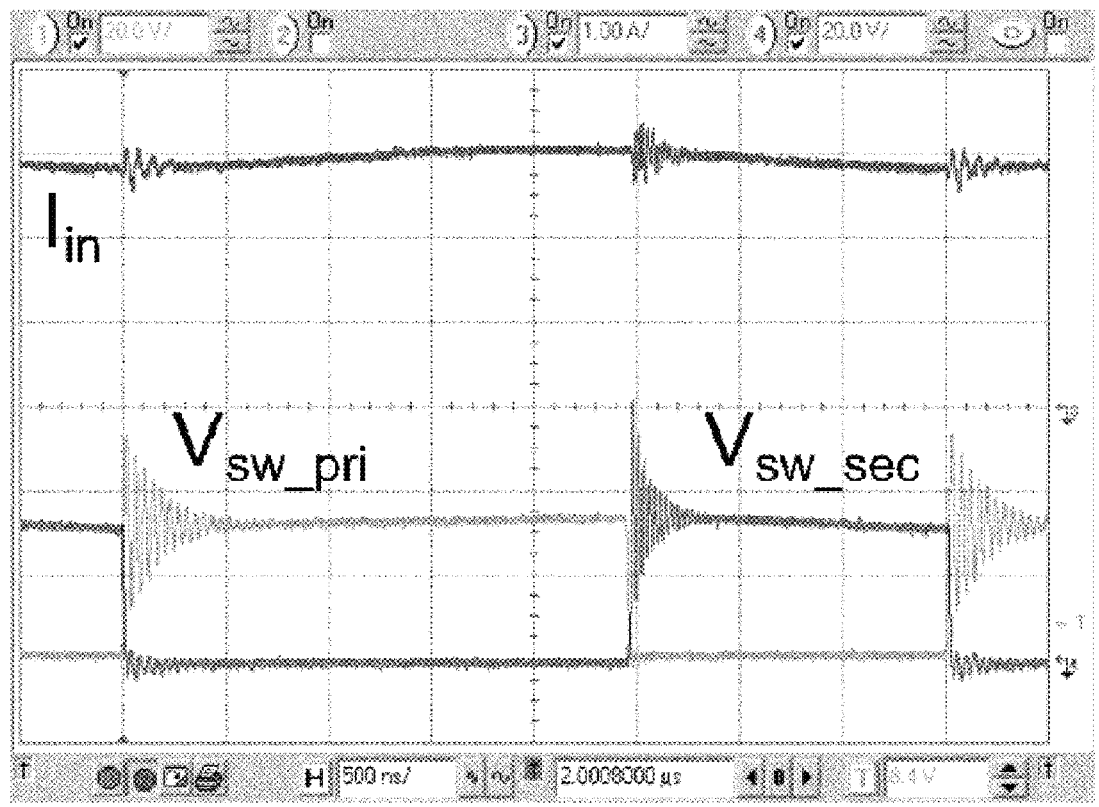
FIG. 2E depicts isolated Ćuk converter switch-node waveforms with $V_{in}$=21V and $V_{out}$=12V, to emulate balancing a stack of six cells in series, and power transfer to the EV LV bus.
Figure 2F:
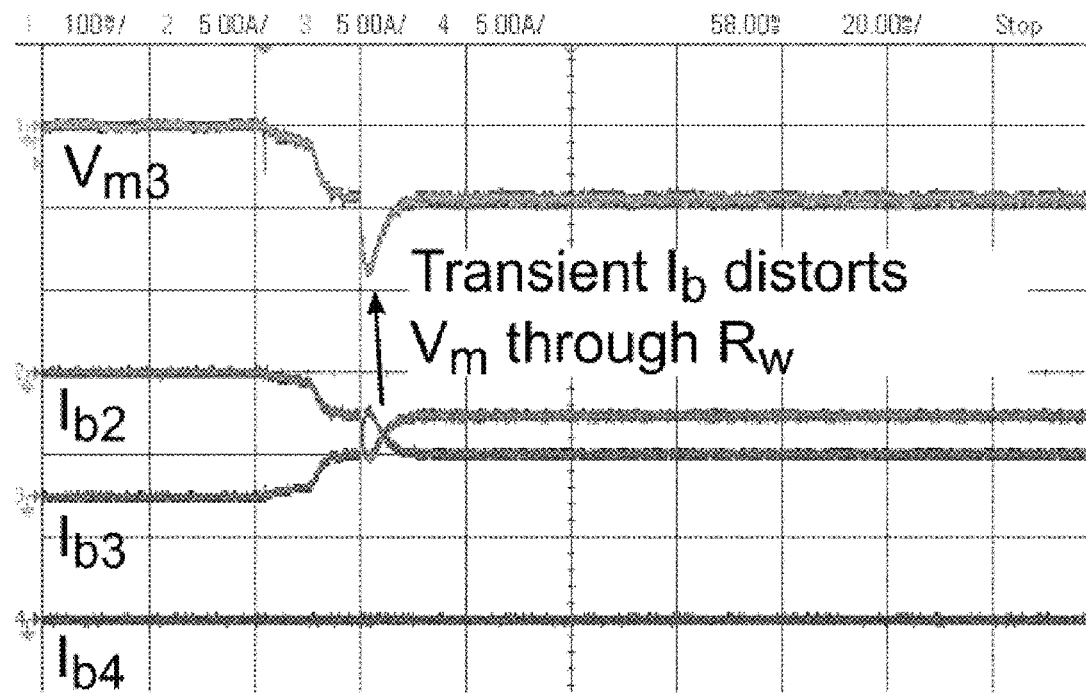
FIG. 2F depicts a start-up transient during $R_w$ extraction, with distorted $V_{m3}$ due to $I_{b3}$.

Battery state estimation is required to operate at all times in order to ensure safe operation within voltage and power limits. In applications utilising cell balancing, it may be necessary to sample $V_{term}$ while $I_b$, as shown in FIG. 2A, is applied according to the balancing command. In such scenarios, the parasitic resistance of the BMS-to-battery connection, $R_w$, may distort the measured cell terminal voltages, $V_m$, at some sampling instances. A measured switch-node waveform is shown in FIG. 2E. FIG. 2E depicts isolated Ćuk converter switch-node waveforms with $V_{in}=21V$ and $V_{out}=12V$, to emulate balancing a stack of six cells in series, and power transfer to the EV LV bus. FIG. 2F depicts a start-up transient during $R_w$ extraction, with distorted $V_{m3}$ due to $I_{b3}$. The $I_{b3}$ start-up transient is seen to cause near 200 mV $V_{m3}$ distortion, despite cell operation below 0.1C. In contrast, the cell has a nominal internal resistance of 0.5 mΩ, which should result in 2.5 mV deviation at the 5 A-peak transient current. Therefore, an uncompensated distortion results in a significant loss of battery voltage measurement accuracy.

Figure 3A:
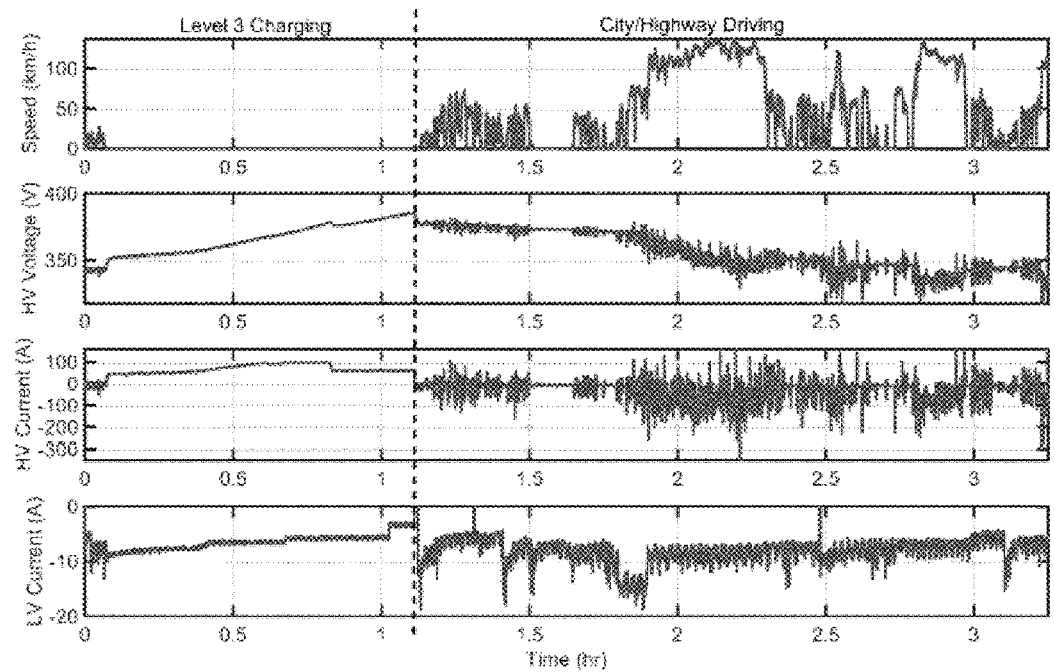
FIG. 3A is a measured Chevrolet Bolt™ speed, High-Voltage (HV) battery voltage and current, and Low-Voltage (LV) load current.

Due to the various factors affecting whether the balancing current is applied at any time instant, the $V_{term}$ samples taken by the BMS may not always coincide with there being zero $I_b$. It may be possible to synchronise the $V_{term}$ sampling with periods where $I_b$ is always zero, but the sampling frequency, which is the same as the state estimation frequency, is typically >=10 Hz, and guaranteeing phases of zero $I_b$ at >=10 Hz is either impractical due to the necessary high-frequency circuit control and transient response stability, or introduces undesirable conducted electro-magnetic interference (EMI) to the high-voltage battery terminals. By way of example, a Chevrolet Bolt™ load profile containing Level-3 fast charge and combined city/highway driving phases, obtained using custom measurement hardware, is shown in FIG. 3A. The measured profile, including LV load, is applied to the battery module and BMS from FIGS. 2A and 2B.

Figure 3B:
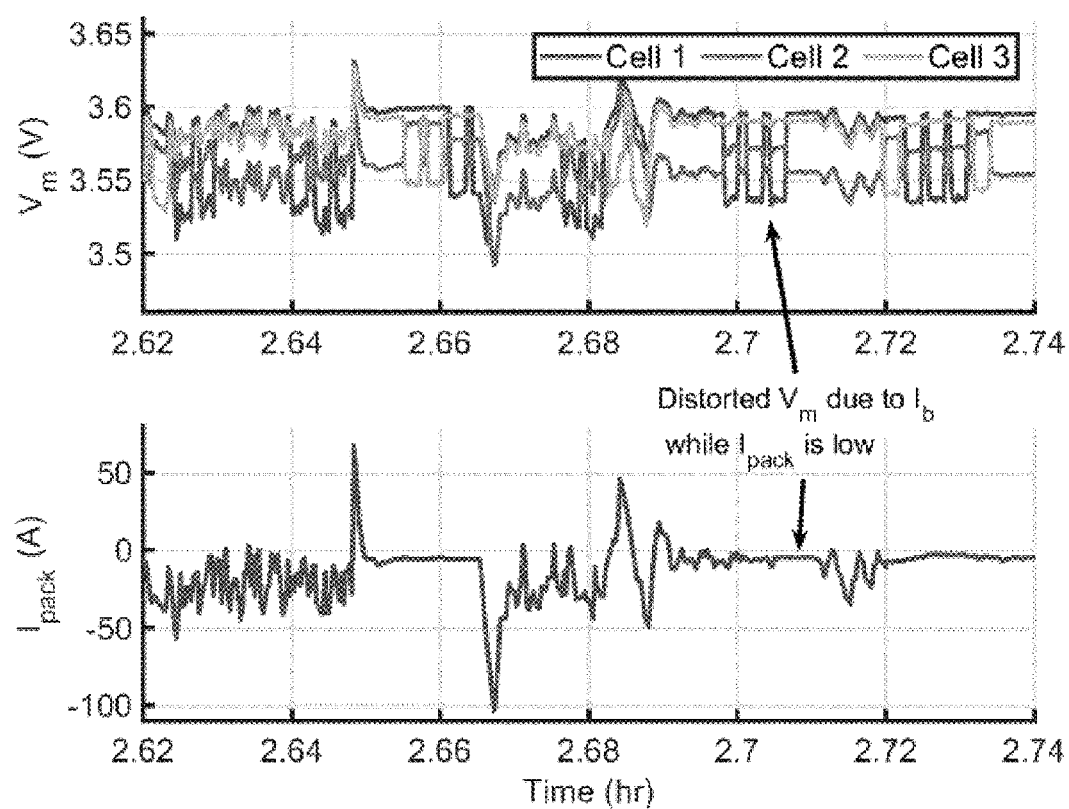
FIG. 3B shows measured $V_m$ and $I_{pack}$ of three adjacent cells from a cycling test performed with the battery of FIG. 2B, imposing the Chevrolet Bolt™ load profile, showing the distortion in $V_m$ due to cell balancing.

To improve efficiency, in at least one embodiment of this invention, the isolated Ćuk converters operate in burst-mode at fixed current. Burst-mode operation of the Ćuk converter and switch matrix is one example of how the circuit topology and the control scheme can affect the overlap between non-zero $I_b$ and $V_{term}$ measurement. The balancing circuit is "engaged," but/p is not always applied to every cell, and it is not practical to synchronise $V_{term}$ measurement with occurrences of zero $I_b$, because 1) the burst-mode on-phase is 10 seconds, 2) duty cycle may be 100% depending on the balancing algorithm, and 3) estimation should occur much faster than 0.1 Hz. The measured voltages of three adjacent cells are shown in FIG. 3B, with the GM Bolt current profile applied. Steps in $V_m$ resulting from the burst-mode converter current are seen to occur without significant steps in $I_{pack}$. Closed-loop state estimation involves adjusting the dynamic model states according to the error between $V_m$ and the estimated $V_{term}$, in order to regulate the error to zero. In FIG. 3B, the $V_m$ distortion has similar magnitude to the $V_{term}$ that occurs from $I_{pack}$ with near 100 A magnitude, therefore $V_m$ distortion leads to significantly distorted estimated battery states.

An improved method of estimating distortion due to wire resistance is disclosed herein. In at least one embodiment, the present disclosure provides a method and battery management system to extract a parasitic resistance of battery connection wires connecting a cell of a battery to a cell balancing circuit. The methods and systems disclosed herein involves extracting the parasitic wire resistances for a battery pack through the coordinated operation of a pack-level current source and cell-level balancing circuit. A voltage drop is imposed and measured across the parasitic resistances while maintaining zero current in the immediate battery cell. Maintaining zero current in the immediate battery cell avoids possible extraction error resulting from voltage drop across the battery cell impedance due to battery cell current flow. Further, the methods and systems disclosed herein do not rely on measurements in adjacent cells to determine parasitic wire resistance of an immediate cell, thus avoiding errors in determining end-of-stack cell connection wire resistances.

While the present disclosure primarily describes the methods and battery management system (BMS) within an electric vehicle (EV) system architecture, a person skilled in the art will appreciate that the methods and BMS may be applicable to other non-vehicle battery-powered electrical systems having controllable loads/sources as described herein.

Automatic Parasitic Resistance Extraction

Figure 4:
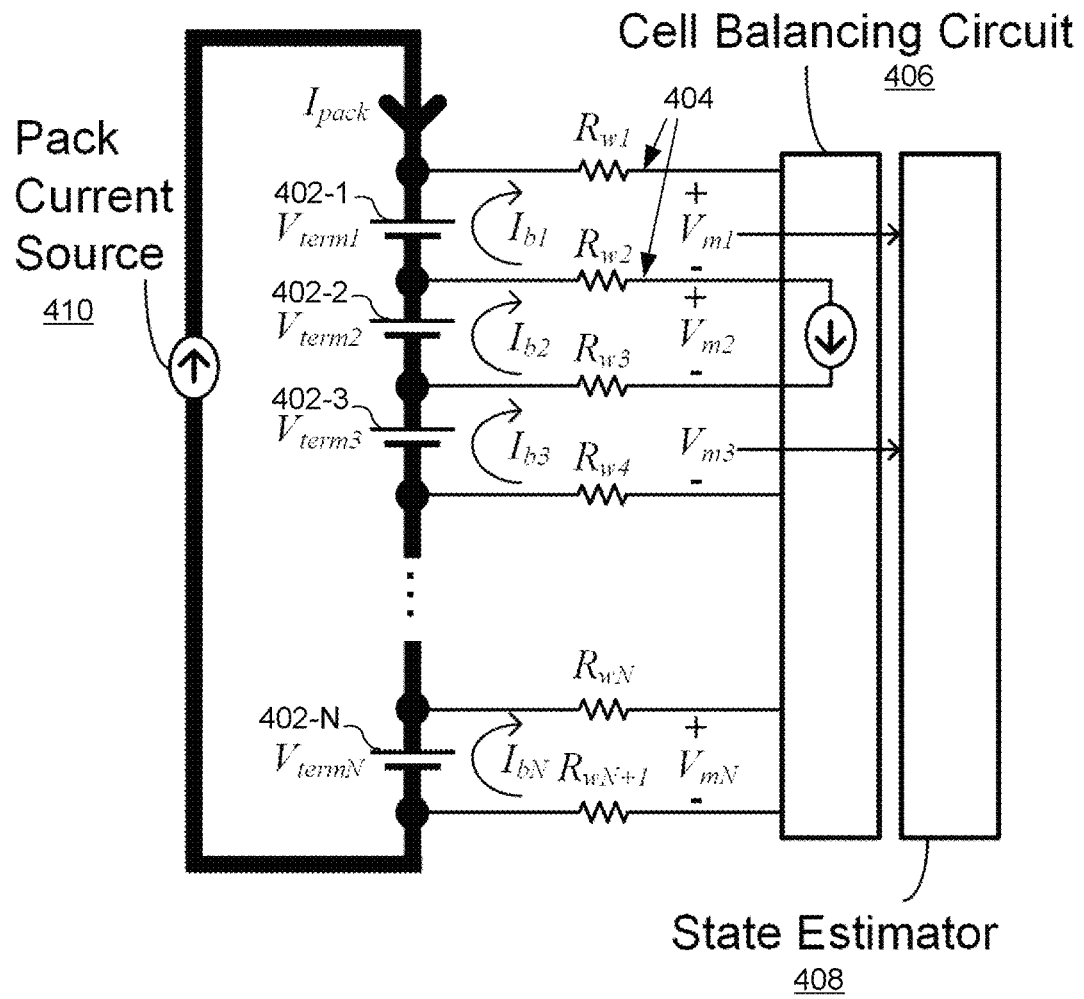
FIG. 4 depicts a representation of a system for extracting parasitic resistance of battery connection wires in cells of a battery stack.

FIG. 4 depicts a representation of a system for extracting parasitic resistance of battery connection wires in cells of a battery stack. The system comprises a plurality of battery cells 402-1, 402-2, 402-3, . . . , 402-N, a cell balancing circuit 406, cell connection wires 404 connecting each of the plurality of battery cells to the cell balancing circuit 406, and a state estimator 408. The cell balancing circuit 406 acts as a current source and applies a balancing current to the battery cells via the cell connection wires. Each of the cell connection wires 404 is connected at a node between two adjacent cells and is configured to carry a balancing current $I_b$ for each of the two adjacent cells adjacent to the node. The cell connection wires are also used for sensing/measuring the cell voltage at the cell terminal to which they are connected. As previously described, the state estimator 408 is configured to sample the cell voltages and pack current, and estimate the SOC and available charge/discharge power. The battery cells 402-1, 402-2, 402-3, . . . , 402-N, are also connected to various other external components and the equivalent circuit of all combined charge and discharge currents is shown as an ideal current source labelled Pack Current Source 410.

Figure 5:
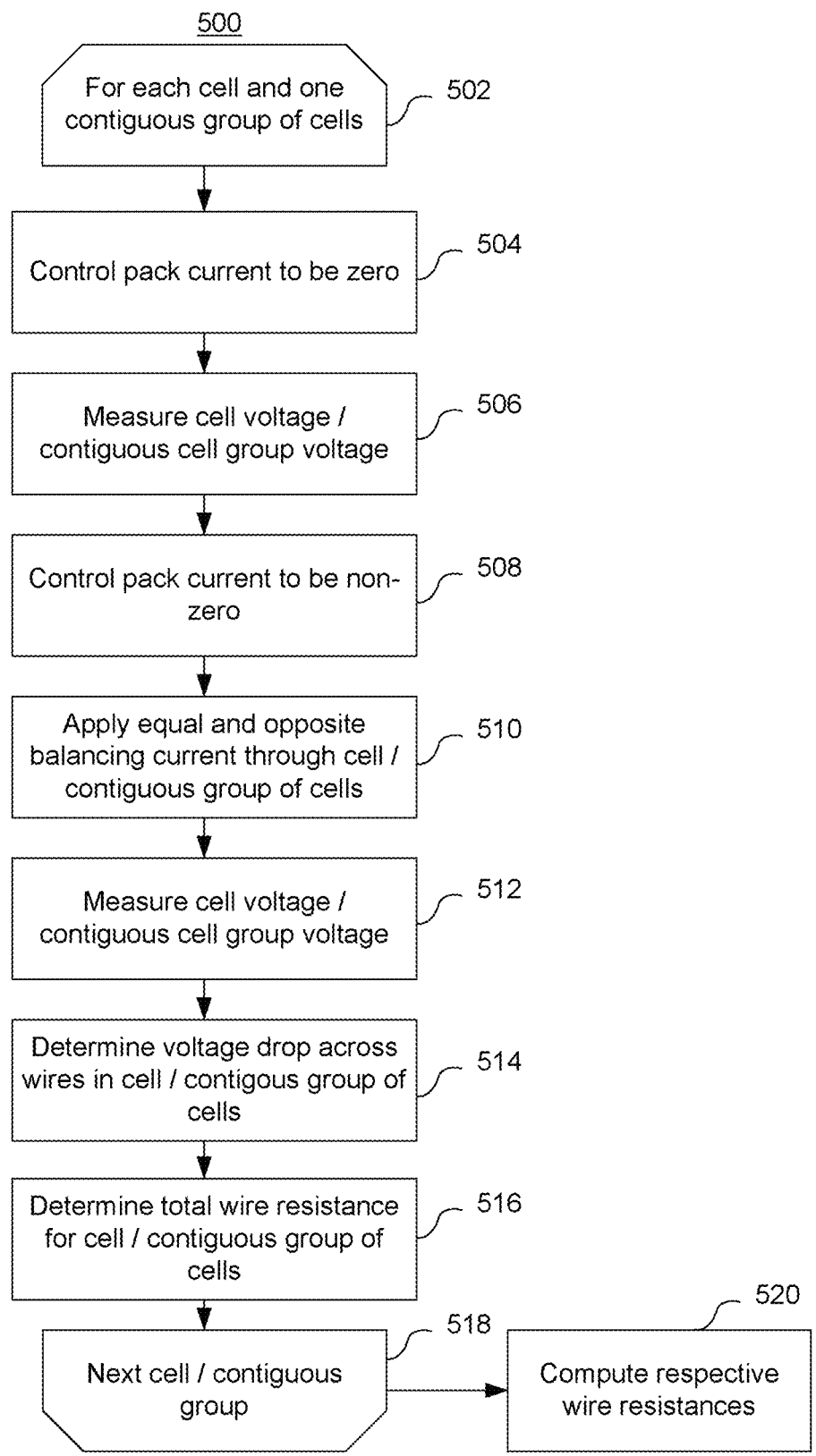
FIG. 5 shows a method of extracting a parasitic resistance of battery connection wires in a battery implemented in the system shown in FIG. 4.

FIG. 5 shows a method 500 of extracting a parasitic resistance of battery connection wires in a battery implemented in the system shown in FIG. 4. The method 500 may be implemented by a processing unit or control unit of a battery management system, as disclosed herein. In the method, the cell voltages may in particular be measured using the battery connection wires that are opposite to the battery terminals of respective cells. That is, there is no separate sensing wire required.

With reference to FIG. 4, the method 500 comprises, for each respective cell of the plurality of cells (i.e. 402-1, 402-2, 402-3, ..., 402-N) and for at least one contiguous group of two or more adjacent cells (502): controlling a pack current from the pack current source through the battery to be zero (504); measuring a first cell voltage of the respective cell, or a first contiguous cell group voltage as a sum of respective cell voltages of the two or more adjacent cells in the contiguous group, with no pack current flowing through the battery (506); controlling the pack current through the battery to be non-zero (508); applying a balancing current to the respective cell or to each of the two or more adjacent cells in the contiguous group, equal to the pack current and flowing in an opposite direction to the pack current (510); measuring a second cell voltage of the respective cell or a second contiguous cell group voltage as a sum of respective cell voltages of the two or more adjacent cells in the contiguous group with the balancing current applied to the respective cell (512); determining a total voltage drop across the battery connection wires of the respective cell or of the two or more adjacent cells in the contiguous group based on the difference between the first and second cell voltages (514); and determining a total parasitic resistance of the battery connection wires of the respective cell or of the two or more adjacent cells in the contiguous group based on the total voltage drop and the balancing current (516). The process may then be repeated for the next cell or contiguous group of cells (518).

In accordance with the method 500 for a respective cell, when the pack current $I_{pack}$ is controlled to be zero, a first voltage of the cell, e.g. cell 402-1 in FIG. 4, is measured. The pack current $I_{pack}$ is controlled to be non-zero such that current flows through each of the battery cells 402-1, 402-2, 402-3, ..., 402-N, and a balancing current, e.g. $I_{b1}$, that is equal to the pack current and flowing in the opposite direction, is applied to the respective cell to be measured, e.g. 402-1, from the cell balancing circuit 406 such that the current within cell 402-1 becomes zero and there is no voltage across the internal cell resistance. A second voltage of the cell 402-1 is measured, and the difference between the first and second measured voltages is a result of voltage drop across the battery connection wires of the respective cell. A total parasitic resistance of the battery connection wires for the cell 402-1, i.e. resistances $R_{w1}+R_{w2}$, is determined from the determined voltage drop and the balancing current $I_{b1}$.

The process is repeated for each cell, i.e. 402-1, 402-2, 402-3, ..., 402-N. As seen from FIG. 4, adjacent cells share a single battery connection wire connecting respective battery terminals of the cells to the cell balancing circuit 406. Thus, when the method 500 is performed for the next cell, i.e. cell 402-2, the total parasitic resistance of the battery connection wires for the cell 402-2 is $R_{w2}+R_{w3}$. Further, the process is performed for a contiguous group of cells comprising two or more adjacent cells. As described below, a parasitic resistance of respective battery connection wires can be determined by solving a system of linear equations. However, as seen from FIG. 4, for N cells there are N+1 connection wires. Therefore, to provide another equation to solve for the N+1 variables (i.e. the resistances of the N+1 connection wires), the process is performed on a contiguous group of two or more adjacent cells.

Using an example where cells 402-1 and 402-2 are taken as the contiguous group of cells, when the pack current $I_{pack}$ is controlled to be zero, a first contiguous cell group voltage is measured as a sum of respective cell voltages of the cells, e.g. cell 402-1 and 402-2 in FIG. 4. The pack current $I_{pack}$ is controlled to be non-zero such that current flows through each of the battery cells 402-1, 402-2, 402-3, ..., 402-N, and a balancing current, e.g. $I_{b1}$ and $I_{b2}$ that is equal to the pack current and flowing in the opposite direction, is applied to the respective cells in the contiguous group of cells, e.g. cells 402-1 and 402-2, from the cell balancing circuit 406 such that the current within cells 402-1 and 402-2 become zero and there is no voltage across the internal cell resistances. A second contiguous cell group voltage is measured as a sum of respective cell voltages of the cells 402-1 and 402-2, and the difference between the first and second contiguous cell group voltages is a result of voltage drop across the battery connection wires of the respective cells. In this case, the balancing currents $I_{b1}$ and $I_{b2}$ are equal to each other (as they are equal to $I_{pack}$) and flow counter to one another along the shared battery connection wire and there is therefore no resistance due to the battery connection wire indicated by $R_{w2}$. Therefore, a total parasitic resistance of the battery connection wires for the contiguous cell group 402-1 and 402-2 is equal to the wire resistances $R_{w1}+R_{w3}$, which is determined from the determined voltage drop and the balancing current $I_{b1}$. As would be readily appreciated, the above discussion of a contiguous cell grouping comprising cells 402-1 and 402-2 is merely provided for the sake of example, and a contiguous group of cells may also comprise more than two adjacent cells, including for example all cells in the battery. In the case of a contiguous group of cells 402-1 to 402-N, the total parasitic resistance of the battery connection wires would be equal to $R_{w1}+R_{wN+1}$.

The method 500 further comprises computing a respective parasitic resistance of respective battery connection wires in the battery based on the total parasitic resistances of the battery connection wires (520). The resistance of respective battery connection wires can be obtained by solving a system of linear equations. The extracted resistances, denoted Rex, are obtained by solving the following system of linear equations:

$$V_{mpre1} - V_{mpost1} = I_{b1}(R_{e1} + R_{e2}),$$

$$\ldots$$

$$V_{mpreN} - V_{mpostN} = I_{bN}(R_{eN} + R_{eN+1}),$$

$$V_{contigpre} - V_{contigpost} = I_{contig}(R_{ec1} + R_{ec2}),$$

where $V_{mprex}$ is the cell terminal voltage of cell "x" as measured when the pack current $I_{pack}$ is controlled to be zero, $V_{mpostx}$ is the cell terminal voltage of cell "x" as measured when the pack current $I_{pack}$ is controlled to be non-zero and the balancing current $I_{bx}$ is applied to the cell, $V_{contigpre}$ is the contiguous cell group voltage as the sum of cell terminal voltages of cells in the contiguous group as measured when the pack current $I_{pack}$ is controlled to be zero, $V_{contigpost}$ is the contiguous cell group voltage as the sum of cell terminal voltages of cells in the contiguous group as measured when the pack current $I_{pack}$ is controlled to be non-zero and a balancing current $I_{contig}$ is applied to each cell in the contiguous group, and $I_{contig}$ is equal to $I_{bx}$ applied to each cell in the contiguous group of cells, and where $R_{ec1}$ and $R_{ec2}$ are defined as the Rex of the top and bottom cell connection wires in the contiguous cell group.

A person skilled in the art will appreciate that the method 500 does not require being performed for each cell sequentially (i.e. first cell 402-1, then cell 402-2, etc.). Further, the method does not have to be performed in real-time. That is, the method could be performed for different cells at different times. As an example, the method may be performed for the contiguous group of cells, and subsequently performed for cell 402-1 multiple times, using the latest values in the linear system of equations for determining respective wire resistances at 520.

The computed parasitic resistance of each of the battery connection wires can be used when estimating a battery state of the battery. In particular, the method may further comprise back-calculating actual cell terminal voltages based on the measured cell voltages and using the parasitic resistances when the balancing current flows. The battery cell states-of-charge and open-circuit voltage can be estimated by a battery state estimator using the back-calculated actual cell terminal voltages.

The parasitic resistances of the respective battery connection wires can be tracked over time and compared to a recorded nominal value. In this manner, if there is a mismatch beyond a predetermined mismatch threshold, a determination may be made that the wire is experiencing corrosion or a connection fault. When the mismatch exceeds the predetermined mismatch threshold, the method may comprise communicating with an external control unit in the battery management system.

Figure 6:
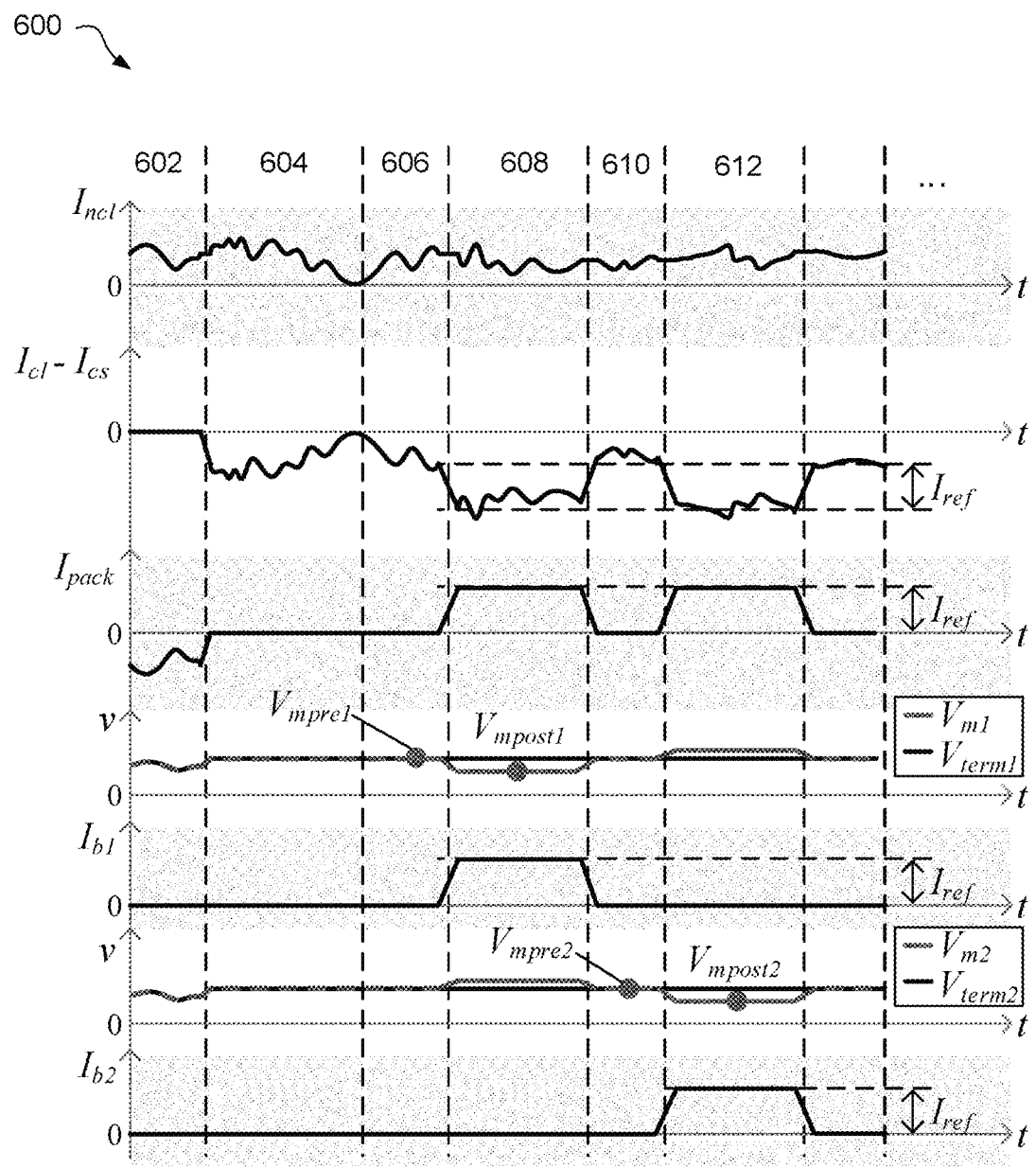
FIG. 6 shows a sample timing diagram 600 for an example implementation of extracting parasitic resistance of battery connection wires.

An example implementation of performing the automatic parasitic extraction method is now described, with reference to FIG. 6, which shows a sample timing diagram 600.

During a time period 602 of the timing diagram 600, the current through the non-controllable loads $I_{ncl}$ is positive, non-zero, and transient (e.g. due to driving, operation of HVAC system, etc.). The difference in currents $I_{cl}$–$I_{cs}$ is zero, and the pack current $I_{pack}$ is negative, to supply the current $I_{ncl}$.

In an example implementation, a vehicle having the above-described battery system is plugged into the power grid through a charging cable/port. The vehicle enters the 'charging' operating mode, and the total battery current, $I_{pack}$, is a relatively low value (below 5 A for an electric vehicle) due to only the auxiliary system loads being active, and battery charging not having started yet. During a time period 604 of the timing diagram 600, the pack current, $I_{pack}$, is set to 0 A by operating the on-board charger such that all vehicle loads are supplied directly from the power grid through the on-board charger. That is, the dynamic non-controllable load current, $I_{ncl}$, is opposed by the controllable loads and sources, $I_{cl}$ and $I_{cs}$, such that the pack current pack is zero.

The cell terminal voltage of cell "x", denoted $V_{mprex}$, is sampled while $I_{pack}$ remains at 0 A. In the timing diagram 600, $V_{mpre1}$ is sampled during a time period 606.

During time period 608, the pack current, $I_{pack}$, is controlled to charge the pack by operating the on-board charger according to a non-zero, relatively-low-magnitude reference value (below 5 A for an electric vehicle), $I_{ref}$. For example, $I_{ref}$ equals 2.5 A. The cell balancing circuit applies balancing current, $I_{b1}$, to the cell under test. The value of $I_{b1}$ has equal magnitude to/ref, but discharges the cell. Upon application of $I_{b1}$, the cell current becomes zero, and no voltage exists across the cell internal resistance. The cell terminal voltage, denoted $V_{mpost1}$, is sampled while $I_{pack}$ and $I_{b1}$ remains at $I_{ref}$. The difference between $V_{mpost1}$ and $V_{mpre1}$ can be used to determine the voltage drop across the wire resistances.

The process is repeated for each cell in the battery pack, with each cell having their voltage sampled before and after $I_{pack}$ and $I_{bx}$ are applied. In the timing diagram 600, the time periods 610 and 612 substantially correspond to the timing periods 606 and 608, but relate to measurements of the second cell. As seen in the time period 608, when $I_{b1}$ is applied to the first cell, $V_{m2}$ rises as a result because the second cell is adjacent the first cell. Therefore, in order to obtain an accurate measurement of $V_{mpre2}$, $I_{pack}$ should be controlled to zero as shown in time period 610.

After sampling voltages for the cell stack, the process is repeated once for any contiguous set of cells (e.g. cells 1 and 2, or all cells in the stack), not shown in the timing diagram 600. In one example, the contiguous cell group may be all cells in the cell stack, and all balancing channels are engaged. The current applied through the contiguous cells is denoted $I_{contig}$, and the contiguous-cell terminal voltages are sampled in this operating state. The sum of the measured contiguous cell voltages is denoted $V_{contigpost}$. Similarly, the sum of $V_{mprex}$ corresponding to the contiguous cells is denoted $V_{contigpre}$. The resistance of respective battery connection wires can be obtained by solving a system of linear equations, as described above.

The extracted Ren value can be used for diagnosis of the BMS-to-cell wiring integrity. In systems where wire corrosion or connection faults may occur due to oxidation, vibration, or other environmental factors, the extracted Ren values may drift or experience sudden changes. By performing periodic wire resistance extraction, the BMS can identify corrosion and connection fault events.

Figure 7:
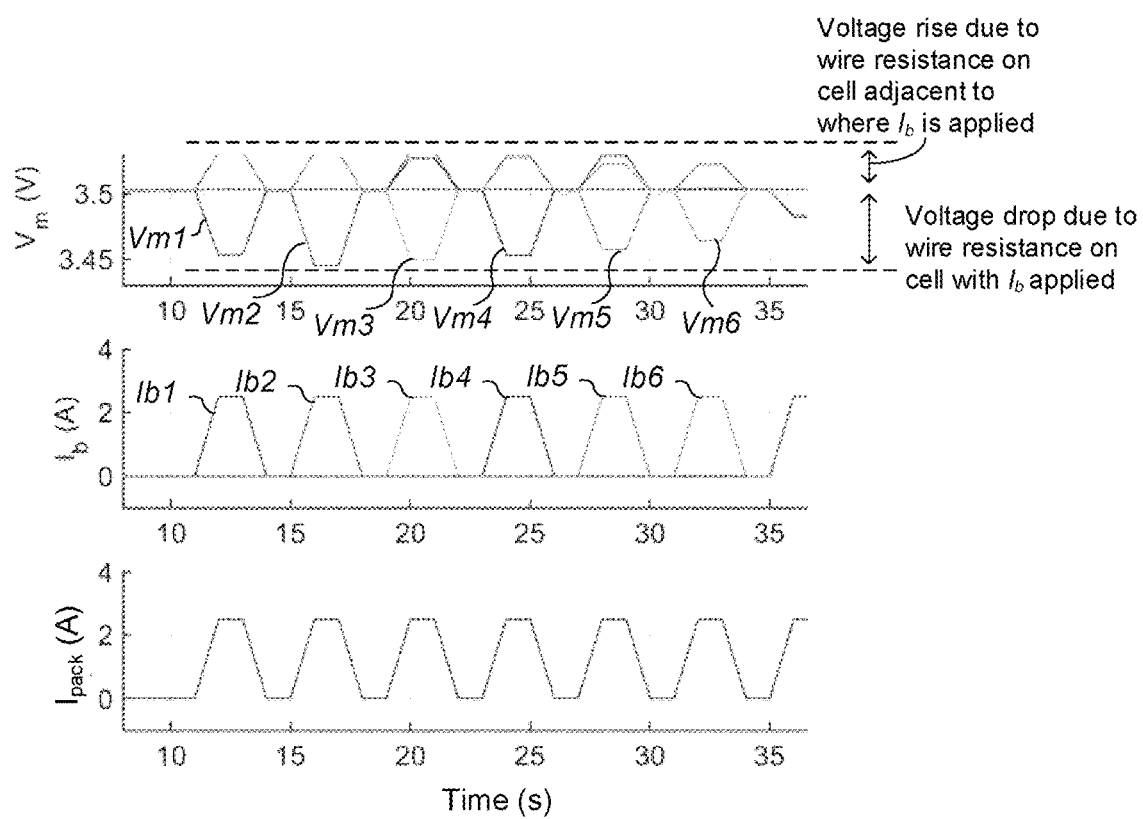
FIG. 7 shows simulated waveforms during an example of extracting parasitic resistance of battery connection wires.

The resistance extraction sequence described above was simulated in MATLAB™ in a 6-series, 4-parallel, 176 Ah Lithium NMC battery module, and the results are shown in FIG. 7. The battery was modelled by a bulk second-order equivalent circuit model for each 4-parallel cell group. The $V_m$ and $I_b$, for cell groups 1 to 6 are shown for the full extraction duration. It can be seen that for each cell when $I_b$ is applied, the $V_m$ changes for the respective cell despite $I_b$ (positive means discharging) and $I_{pack}$ (positive means charging) opposing each other at the cell to ensure zero cell current. The voltage changes seen on $V_m$ can thus be fully attributed to the distortion introduced by the balancing current passing through the parasitic wire resistances. The discharging balancing current imposes a voltage drop on the immediate-cell $V_m$, and a voltage rise on the adjacent-cell $V_m$. During the final step of the extraction sequence, where the contiguous cell group is the full 6-series module, only the top and bottom cells experience distorted $V_m$.

A wide range of alternatives exist for implementation of battery cell state estimation.

Possible variations of the disclosed extraction method may be based on the method in which $I_{pack}$ is applied to the battery pack. It is theoretically possible that the Controllable Loads and Sources highlighted as part of the battery-powered electric vehicle architecture above may be controlled together to apply the pack current required for resistance extraction. However, a practical implementation would likely make use of only one. Below are two possible alternative variations:

(1) The dc-dc converter may be used in place of the on-board charger, and the power flow induced during the extraction sequence is routed to the lead-acid battery, which is an energy storage device.
(2) The balancing converters may individually track the battery pack current and apply balancing current such that $I_{pack}$ is zero during the $V_{mpostx}$ measurement phases of the extraction sequence.

In some cases, model computations are stored in the program memory of processing units located in the BMS and executed periodically or intermittently. In other cases, the model computations are implemented as clocked logic circuits in field programmable gate arrays (FPGAs) in the BMS, and the circuits operate periodically. Model parameters are typically stored in memory and accessed at each computation cycle. In some cases, model parameters may be updated periodically through on-line battery cell characterization.

In another embodiment, given an accurate current regulator, it is not necessary to sense the balancing current during the resistance extraction sequence, but it is envisioned that systems requiring extraction accuracy beyond a desired threshold may make use of a current sensor whose maximum sampling accuracy and frequency matches that of the voltage sensor.

In another embodiment, the battery state estimated using the extracted wire resistance may include, but is not limited to, the cell state-of-charge, voltage-to-current response, maximum available charge or discharge power, and capacity or impedance degradation.

In another embodiment, the battery management system and control unit may be implemented as a single system, separate modules of a battery system, or separate modules spread across a larger system making use of the battery system. Examples of a larger system include, but are not limited to electric vehicles, battery energy storage systems connected to a power grid to provide power quality support, and battery energy storage systems serving household or industrial loads.

Aside from lithium-ion battery packs, it is envisioned that the methods and systems may be applied to any modular, rechargeable electrical or electrochemical storage system requiring cell balancing, including but not limited to electrostatic double-layer capacitors, lead-acid batteries, and lithium-ion capacitors.

The balancing circuit used to apply the balancing current to the cells may have varying circuit topology, control scheme, and be operated according to varying cell balancing algorithms. It is envisioned that overall state estimation distortion while cell balancing is engaged may be reduced through a combination of variable parasitic resistance extraction accuracy, dependent on the extraction timing and measurement accuracy, and synchronisation between $V_{term}$ measurement and balancing circuit operation, to reduce the total number of distorted $V_{term}$ measurement samples.

These methods can be implemented in hardware, software, firmware or as any suitable combination thereof. That is, if implemented as software, the computer-readable medium comprises instructions in code which when loaded into memory and executed on a processor of a server or a user computing device such as a tablet or mobile device causes the user computing device to perform any of the foregoing method steps. These method steps may be implemented as software, i.e. as coded instructions stored on a computer readable medium which performs the foregoing steps when the computer readable medium is loaded into memory and executed by the microprocessor of the mobile device. A computer readable medium can be any means that contain, store, communicate, propagate or transport the program for use by or in connection with the instruction execution system, apparatus or device. The computer-readable medium may be electronic, magnetic, optical, electromagnetic, infrared or any semiconductor system or device. For example, computer executable code to perform the methods disclosed herein may be tangibly recorded on a computer-readable medium including, but not limited to, a floppy-disk, a CD-ROM, a DVD, RAM, ROM, EPROM, Flash Memory or any suitable memory card, etc. The method may also be implemented in hardware. A hardware implementation might employ discrete logic circuits having logic gates for implementing logic functions on data signals, an application-specific integrated circuit (ASIC) having appropriate combinational logic gates, a programmable gate array (PGA), a field programmable gate array (FPGA), etc.

For the purposes of interpreting this specification, when referring to elements of various embodiments of the present invention, the articles "a", "an", "the" and "said" are intended to mean that there are one or more of the elements. The terms "comprising", "including", "having", "entailing" and "involving", and verb tense variants thereof, are intended to be inclusive and open-ended by which it is meant that there may be additional elements other than the listed elements.

This invention has been described in terms of specific implementations and configurations which are intended to be exemplary only. Persons of ordinary skill in the art will appreciate that many obvious variations, refinements and modifications may be made without departing from the inventive concepts presented in this application. The scope of the exclusive right sought by the Applicant(s) is therefore intended to be limited solely by the appended claims.

The invention claimed is:

1. A method of extracting a parasitic resistance of battery connection wires in a battery, wherein the battery comprises a plurality of cells, each respective cell of the plurality of cells comprising battery connection wires connecting battery terminals of the respective cell to a cell balancing circuit, the method comprising:

for each respective cell of the plurality of cells and for a contiguous group of two or more adjacent cells:
controlling a pack current through the battery to be zero;
measuring a first cell voltage of the respective cell, or a first contiguous cell group voltage as a sum of respective cell voltages of the two or more adjacent cells in the contiguous group, with no pack current flowing through the battery;
controlling the pack current through the battery to be non-zero;
applying a balancing current to the respective cell or to each of the two or more adjacent cells in the contiguous group, equal to the pack current and flowing in an opposite direction to the pack current;
measuring a second cell voltage of the respective cell, or a second contiguous cell group voltage as a sum of respective cell voltages of the two or more adjacent cells in the contiguous group, with the balancing current applied to the respective cell or to each of the two or more adjacent cells in the contiguous group;
determining a total voltage drop across the battery connection wires of the respective cell or of the two or more adjacent cells in the contiguous group based on the difference between the first and second cell voltages; and
determining a total parasitic resistance of the battery connection wires of the respective cell or of the two or more adjacent cells in the contiguous group based on the total voltage drop and the balancing current; and computing a respective parasitic resistance of respective battery connection wires in the battery based on the total parasitic resistances of the battery connection wires.

2. The method of claim 1, wherein computing the respective parasitic resistance of respective battery connection wires in the battery comprises solving a system of linear equations.

3. The method of claim 1, wherein the method is performed for each respective cell and for the contiguous group of cells in real-time.

4. The method of claim 1, wherein the method is performed for each respective cell and for the contiguous group of cells at different times.

5. The method of claim 1, wherein the contiguous group of cells comprises two adjacent cells.

6. The method of claim 1, wherein the contiguous group of cells comprises all of the plurality of cells.

7. The method of claim 1, further comprising:
using the computed parasitic resistances of respective battery connection wires to estimate a battery state of the battery.

8. The method of claim 1, wherein:
the cell voltages are measured using the battery connection wires, opposite to the battery terminals of the respective cells.

9. The method of claim 1, further comprising back-calculating actual cell terminal voltages based on the measured cell voltages and using the parasitic resistances when the balancing current flows.

10. The method of claim 9, further comprising estimating, using a battery state estimator, the battery cell states-of-charge and open-circuit voltage using the back-calculated actual cell terminal voltages.

11. The method of claim 1, further comprising:
tracking the parasitic resistances of the battery connection wires over time and periodically comparing the parasitic resistances to a recorded nominal value; and
checking for a mismatch beyond a predetermined mismatch threshold to determine whether corrosion or connection faults have occurred.

12. The method of claim 11, further comprising:
communicating with an external control unit in the battery management system when the mismatch exceeds the predetermined mismatch threshold.

13. The method of claim 1 wherein the battery is a lithium-ion battery.

* * * * *